US012685228B2

(12) United States Patent
Kim

(10) Patent No.: US 12,685,228 B2
(45) Date of Patent: Jul. 14, 2026

(54) SEMICONDUCTOR PACKAGE

(71) Applicant: Samsung Electronics Co., Ltd.,
Suwon-si (KR)

(72) Inventor: Hongjin Kim, Suwon-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 390 days.

(21) Appl. No.: 18/391,942

(22) Filed: Dec. 21, 2023

(65) Prior Publication Data

US 2024/0347499 A1 Oct. 17, 2024

(30) Foreign Application Priority Data

Apr. 13, 2023 (KR) ........................ 10-2023-0048785

(51) Int. Cl.
*H10W 90/00* (2026.01)
*H10W 72/00* (2026.01)
(Continued)

(52) U.S. Cl.
CPC ...... *H10W 90/00* (2026.01); *H10W 72/07554*
(2026.01); *H10W 72/5445* (2026.01); *H10W
72/5449* (2026.01); *H10W 72/547* (2026.01);
*H10W 72/5473* (2026.01); *H10W 72/552*
(2026.01); *H10W 72/5522* (2026.01); *H10W
72/5524* (2026.01); *H10W 72/5525* (2026.01);
*H10W 72/932* (2026.01);
(Continued)

(58) Field of Classification Search
CPC ... H10W 90/00; H10W 90/24; H10W 90/752;
H10W 74/117; H10W 72/075; H10W
72/547; H10W 72/5473
See application file for complete search history.

(56) References Cited

U.S. PATENT DOCUMENTS

| 8,233,303 B2 | 7/2012 | Best et al. |
| 11,107,771 B2 | 8/2021 | Chun et al. |
(Continued)

FOREIGN PATENT DOCUMENTS

| KR | 102402914 B1 | 5/2022 |
| KR | 20220086164 A | 6/2022 |
(Continued)

*Primary Examiner* — Mohsen Ahmadi
(74) *Attorney, Agent, or Firm* — Wolf, Greenfield &
Sacks, P.C.

(57) ABSTRACT
A semiconductor package includes a package substrate
including a power pad and a ground pad that are spaced apart
from each other in a first horizontal direction, first and
second semiconductor chips on the package substrate, the
first and second semiconductor chips being stacked in a
stepped shape that extends in a second horizontal direction
perpendicular to the first horizontal direction, and a plurality
of connection wires that electrically connect the package
substrate to the first semiconductor chip and/or the second
semiconductor chip. The first semiconductor chip includes a
plurality of lower option pads. The second semiconductor
chip includes a plurality of upper option pads. The plurality
of connection wires include a conductive wire that electri-
cally connects at least one of first and second upper chip
pads of the second semiconductor chip to at least one of the
lower option pads of the first semiconductor chip.

20 Claims, 3 Drawing Sheets

(51) Int. Cl.

| | |
|---|---|
| *H10W 72/50* | (2026.01) |
| *H10W 72/90* | (2026.01) |
| *H10W 74/10* | (2026.01) |
| *H10W 90/24* | (2026.01) |

(52) U.S. Cl.
CPC ........ *H10W 72/9445* (2026.01); *H10W 90/24* (2026.01); *H10W 90/752* (2026.01); *H10W 90/754* (2026.01)

(56) References Cited

U.S. PATENT DOCUMENTS

| | | | |
|---|---|---|---|
| 11,605,615 B2 | 3/2023 | Bang et al. | |
| 2018/0145053 A1* | 5/2018 | Jung | H10W 90/00 |
| 2021/0391270 A1 | 12/2021 | Chun et al. | |
| 2022/0059473 A1* | 2/2022 | Park | H10W 42/121 |

| | | | |
|---|---|---|---|
| 2022/0189914 A1 | 6/2022 | Park | |
| 2022/0352124 A1* | 11/2022 | Kim | H10W 90/00 |
| 2023/0005884 A1 | 1/2023 | Park et al. | |
| 2023/0009850 A1* | 1/2023 | Baek | H10W 90/00 |
| 2023/0035026 A1* | 2/2023 | Kim | H10W 70/68 |
| 2023/0343746 A1* | 10/2023 | Park | H10W 90/00 |
| 2023/0369282 A1* | 11/2023 | Kim | H10W 74/117 |
| 2023/0395568 A1* | 12/2023 | Kim | H10W 90/00 |
| 2024/0023346 A1* | 1/2024 | Cheong | H10B 80/00 |
| 2024/0055405 A1* | 2/2024 | Oh | H10W 74/137 |
| 2024/0071943 A1* | 2/2024 | Song | H10W 70/65 |
| 2024/0186290 A1* | 6/2024 | Kim | H10W 74/117 |
| 2024/0203943 A1* | 6/2024 | Kim | H10W 90/00 |

FOREIGN PATENT DOCUMENTS

| | | |
|---|---|---|
| KR | 20220144205 A | 10/2022 |
| KR | 20230004147 A | 1/2023 |

\* cited by examiner

10

Z DIRECTION

Y DIRECTION

X DIRECTION

FIG. 3

SEMICONDUCTOR PACKAGE

CROSS-REFERENCE TO RELATED APPLICATION

This application claims priority under 35 U.S.C. § 119 to Korean Patent Application No. 10-2023-0048785, filed on Apr. 13, 2023 in the Korean Intellectual Property Office (KIPO), the contents of which are herein incorporated by reference in their entirety.

BACKGROUND

Example embodiments relate to a semiconductor package. More particularly, example embodiments relate to a semiconductor package including a plurality of semiconductor chips that are stacked on a package substrate.

As a package size of a semiconductor package is further reduced and a data transmission speed is further increased, signal quality needs to be secured. In a semiconductor package having a flash chip—a package substrate and a plurality of semiconductor chips may exchange data signals, power signals, and ground signals with each other. A plurality of substrate pads (bond fingers) exposed on an upper surface of the package substrate may be electrically connected to a plurality of chip pads exposed on upper surfaces of the semiconductor chips through conductive wires. When the substrate pads are respectively connected to the chip pads, there is a problem in that signal quality improvement is limited due to securing an area for providing substrate pads.

SUMMARY

Example embodiments provide a semiconductor package having improved signal transmission characteristics and/or heat dissipation characteristics between a package substrate and a plurality of semiconductor chips.

According to example embodiments, a semiconductor package includes a package substrate including a power pad and a ground pad that are spaced apart from each other in a first horizontal direction, first and second semiconductor chips on the package substrate, the first and second semiconductor chips being stacked in a stepped shape that extends in a second horizontal direction perpendicular to the first horizontal direction, and a plurality of connection wires that electrically connect the package substrate to the first semiconductor chip and/or the second semiconductor chip. The first semiconductor chip includes a first lower chip pad, a second lower chip pad, and a plurality of lower option pads that are spaced apart from the first and second lower chip pads in the first horizontal direction. The second semiconductor chip includes a first upper chip pad, a second upper chip pad, and a plurality of upper option pads that are spaced apart from the first and second upper chip pads in the first horizontal direction. The plurality of connection wires include a plurality of first conductive wires that electrically connect the power pad and the ground pad to the first and second lower chip pads, respectively, a plurality of second conductive wires that electrically connect the first and second lower chip pads to the first and second upper chip pads, respectively, and a third conductive wire that electrically connects at least one of the first and second upper chip pads to at least one of the lower option pads.

According to example embodiments, a semiconductor package includes a package substrate including a power pad and a ground pad that are spaced apart from each other in a first horizontal direction, a first semiconductor chip stacked on the package substrate, the first semiconductor chip including a first lower chip pad that is spaced apart from the power pad in a second horizontal direction perpendicular to the first horizontal direction, a second lower chip pad that is spaced apart from the ground pad in the second horizontal direction, and a plurality of lower option pads that are spaced apart from the first and second lower chip pads in the first horizontal direction, a plurality of first conductive wires that electrically connect the power pad and the ground pad to the first and second lower chip pads, respectively, a second semiconductor chip stacked on the first semiconductor chip, the second semiconductor chip including a first upper chip pad that is spaced apart from the power pad in the second horizontal direction, a second upper chip pad that is spaced apart from the ground pad in the second horizontal direction, and a plurality of upper option pads that are spaced apart from the first and second upper chip pads in the first horizontal direction, a plurality of second conductive wires that electrically connect the first and second lower chip pads to the first and second upper chip pads, respectively, and a third conductive wire that electrically connects at least one of the first and second upper chip pads to at least one of the lower option pads.

According to example embodiments, a semiconductor package includes a package substrate including a power pad and a ground pad that are spaced apart from each other in a first horizontal direction, first and second semiconductor chips stacked on the package substrate in a stepped shape that extends in a second horizontal direction perpendicular to the first horizontal direction, a plurality of connection wires that electrically connect the package substrate to the first semiconductor chip and/or the second semiconductor chip, and a molding member that is on the first and second semiconductor chips and the package substrate. The first semiconductor chip includes a first lower chip pad that is spaced apart from the power pad in the second horizontal direction, a second lower chip pad that is spaced apart from the ground pad in the second horizontal direction, and a plurality of lower option pads that are spaced apart from the first and second lower chip pads in the first horizontal direction. The second semiconductor chip includes a first upper chip pad that is spaced apart from the power pad in the second horizontal direction, a second upper chip pad that is spaced apart from the ground pad in the second horizontal direction, and a plurality of upper option pads that are spaced apart from the first and second upper chip pads in the first horizontal direction, the plurality of upper option pads being spaced apart from the plurality of lower option pads in the second horizontal direction. The plurality of connection wires include a plurality of first conductive wires that electrically connect the power pad and the ground pad to the first and second lower chip pads, respectively, a plurality of second conductive wires that electrically connect the first and second lower chip pads to the first and second upper chip pads, respectively, and a third conductive wire that electrically connects at least one of the first and second upper chip pads to at least one of the lower option pads. The first and second lower chip pads and the plurality of lower option pads are free of at least a portion of an upper surface of the first semiconductor chip thereon. The first and second upper chip pads and the plurality of upper option pads are free of at least a portion of an upper surface of the second semiconductor chip thereon.

According to example embodiments, a semiconductor package may include a package substrate including a power pad and a ground pad that are spaced apart from each other in a first horizontal direction, first and second semiconductor chips on the package substrate, the first and second semiconductor chips being stacked in a stepped shape that extends in a second horizontal direction perpendicular to the first horizontal direction, and a plurality of connection wires that electrically connect the package substrate to the first semiconductor chip and/or the second semiconductor chip. The first semiconductor chip may include a first lower chip pad that is spaced apart from the power pad, a second lower chip pad that is spaced apart from the ground pad, and a plurality of lower option pads that are spaced apart from the first and second lower chip pads in the first horizontal direction. The second semiconductor chip may include a first upper chip pad that is spaced apart from the power pad, a second upper chip pad that is spaced apart from the ground pad, and a plurality of upper option pads that are spaced apart from the first and second upper chip pads in the first horizontal direction. The plurality of connection wires may include a plurality of first conductive wires that electrically connect the power pad and the ground pad to the first and second lower chip pads, respectively, a plurality of second conductive wires that electrically connect the first and second lower chip pads to the first and second upper chip pads, respectively, and a third conductive wire that electrically connects at least one of the first and second upper chip pads to at least one of the lower option pads.

Accordingly, the first semiconductor chip stacked on the package substrate may receive a power signal and a ground signal from the power pad and the ground pad that are electrically connected to the first and second lower chip pads through the first conductive wires, respectively. The second semiconductor chip stacked on the first semiconductor chip may receive the power signal and the ground signal from the first and second lower chip pads that are electrically connected to the first and second upper chip pads through the second conductive wires, respectively. The lower option pads of the first semiconductor chip may receive the power signal or the ground signal from the at least one of the first and second upper chip pads that are electrically connected to the lower option pads through the third conductive wires.

Since the third conductive wires transmit the power signal or the ground signal from the first upper chip pad or the second upper chip pad to the lower option pads, the semiconductor package might not include additional power pads and additional ground pads for transmitting the power signal or the ground signal to the lower option pads. Since the package substrate does not include the additional power pad and the additional ground pad, pattern routability for providing a pattern may be secured. The pattern routability may be utilized to improve signal quality of the package substrate.

BRIEF DESCRIPTION OF THE DRAWINGS

Example embodiments will be more clearly understood from the following detailed description taken in conjunction with the accompanying drawings. FIGS. 1 to 3 represent non-limiting, example embodiments as described herein.

FIG. 1 is a perspective view illustrating a semiconductor package in accordance with example embodiments.

FIG. 2 is a plan view illustrating the semiconductor package in FIG. 1.

FIG. 3 is a cross-sectional view taken along the line A-A', the line B-B' and the line C-C' in FIG. 2.

DETAILED DESCRIPTION

Hereinafter, example embodiments will be explained in detail with reference to the accompanying drawings.

Figure 1:
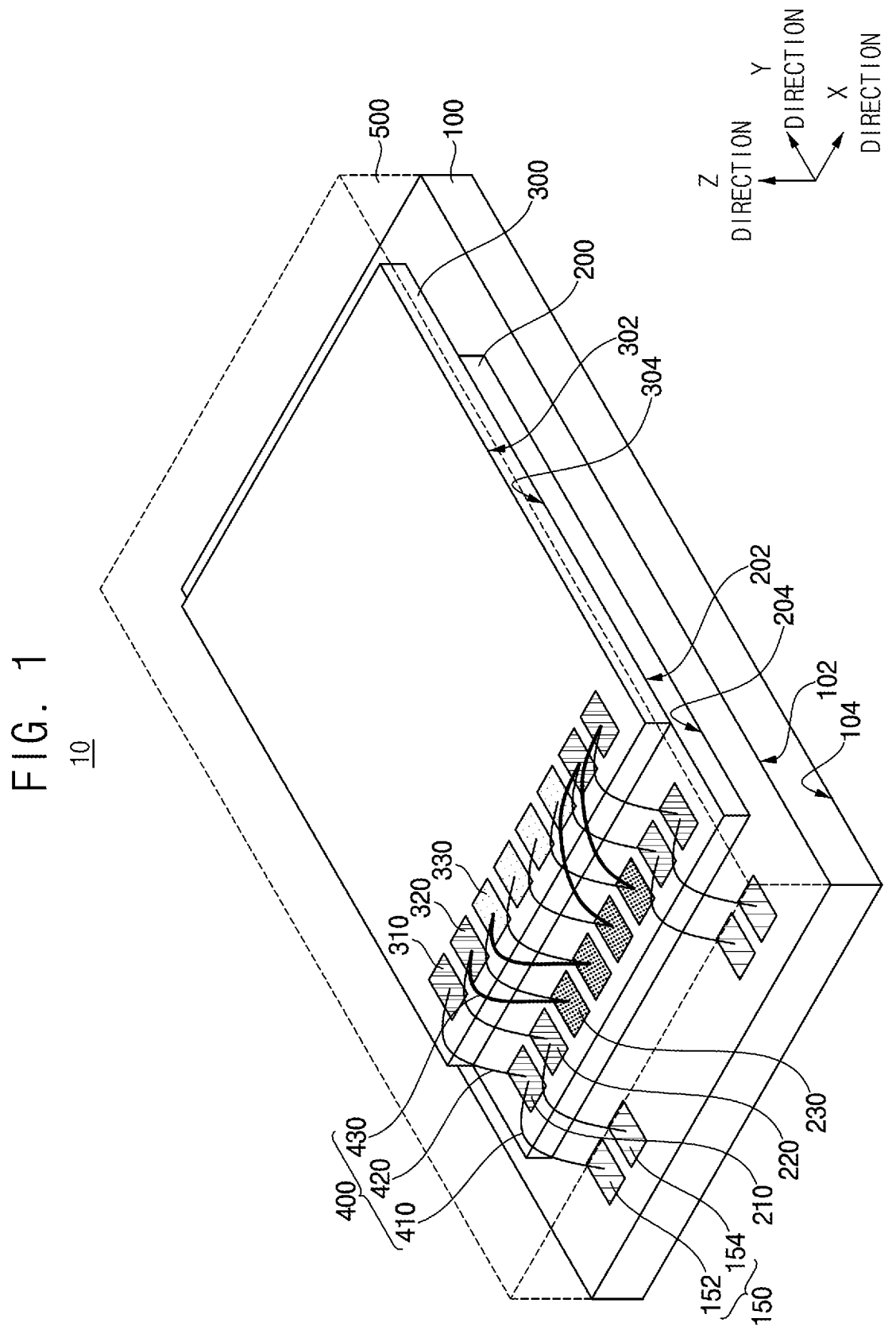
Figure 2:
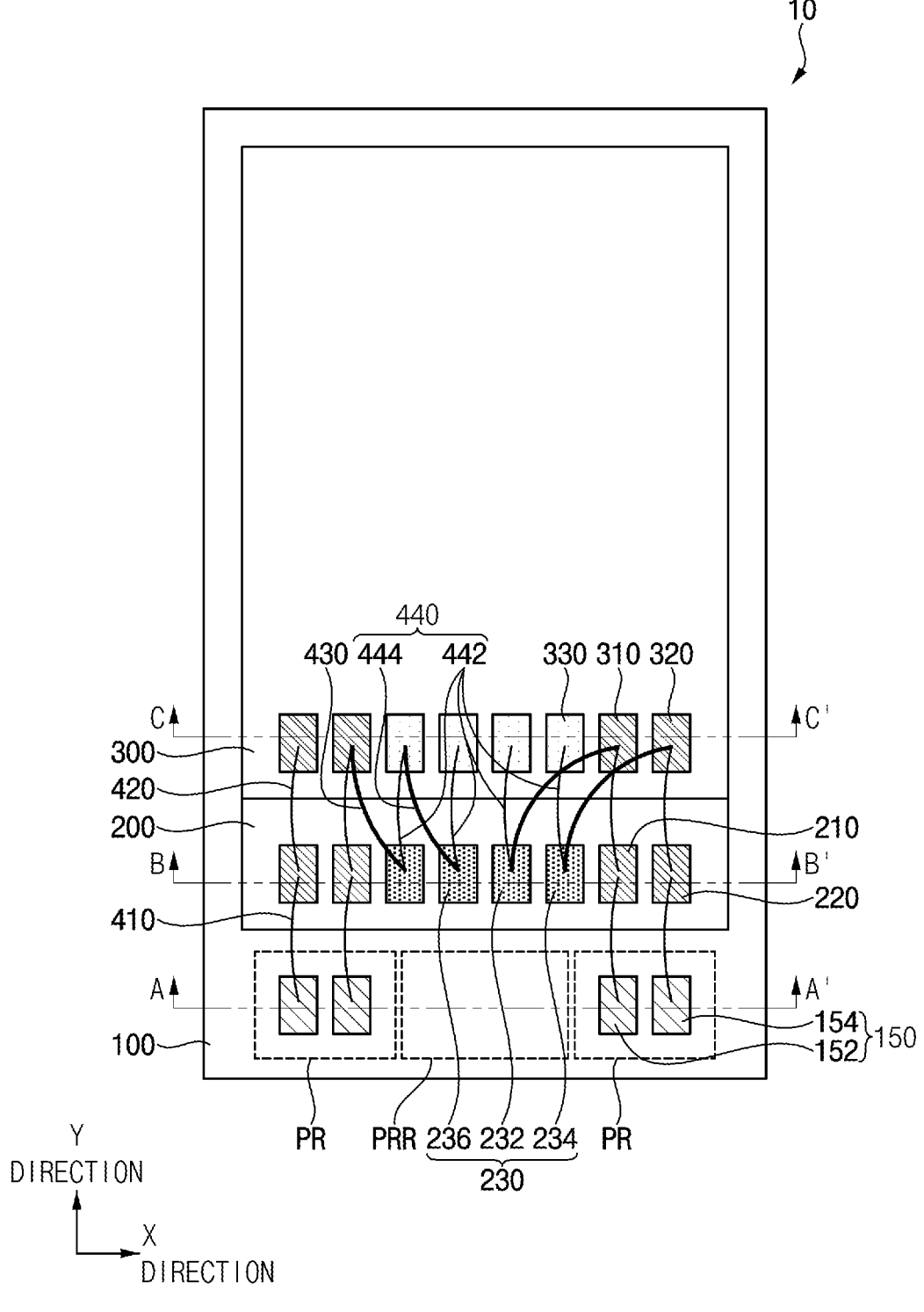
Figure 3:
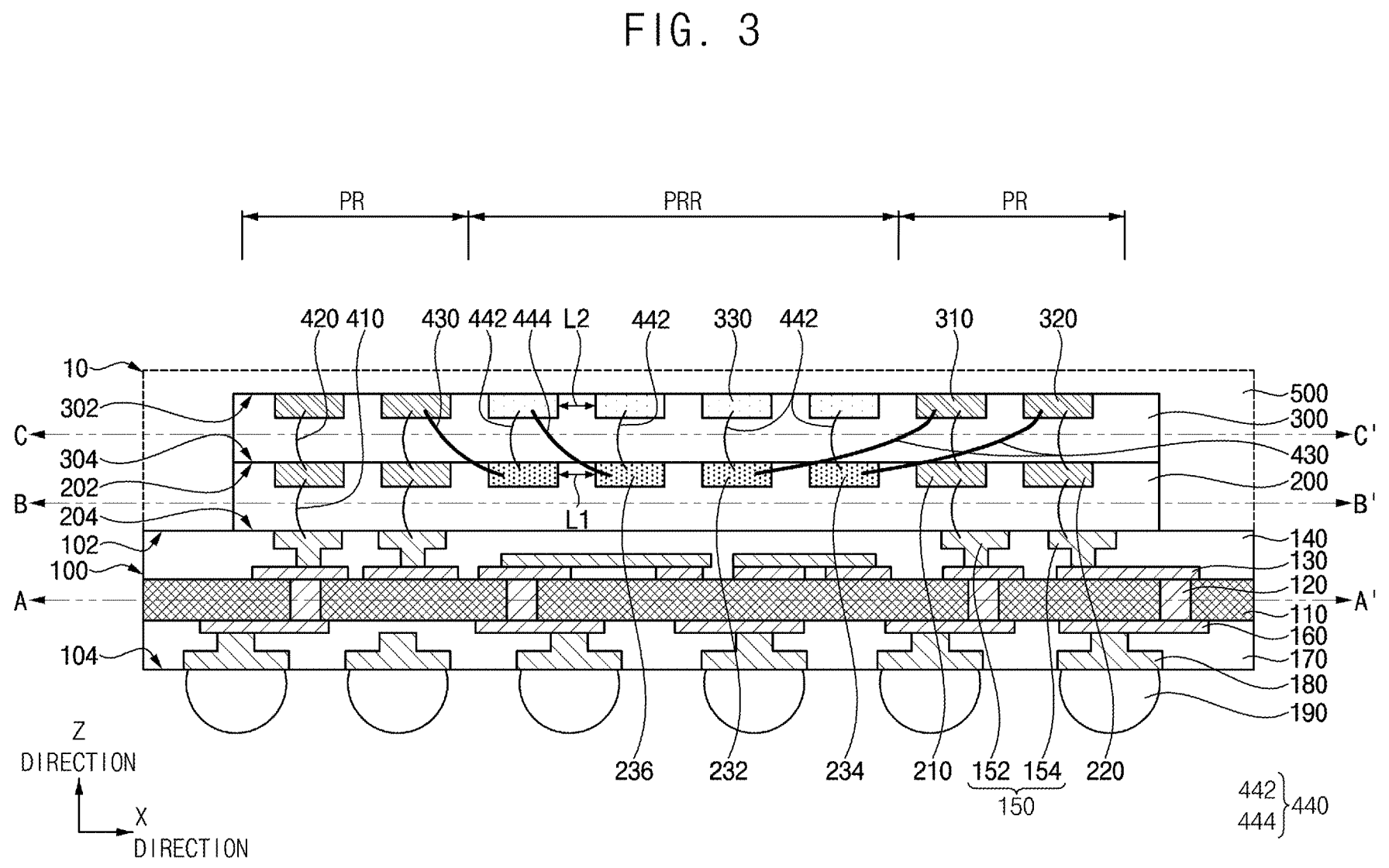

FIG. 1 is a perspective view illustrating a semiconductor package in accordance with example embodiments. FIG. 2 is a plan view illustrating the semiconductor package in FIG. 1. FIG. 3 is a cross-sectional view taken along the line A-A', the line B-B' and the line C-C' in FIG. 2.

Referring to FIGS. 1 to 3, a semiconductor package 10 may include a package substrate 100, first and second semiconductor chips 200 and 300 sequentially stacked on the package substrate 100, and a plurality of connection wires 400 electrically connecting the package substrate 100 and the first and second semiconductor chips 200 and 300.

In example embodiments, the package substrate 100 may have a first surface 102 and a second surface 104 opposite to the first surface 102. The first and second semiconductor chips 200 and 300 may be sequentially stacked on the first surface 102 of the package substrate 100, and the package substrate 100 may be electrically connected to the first and second semiconductor chips 200 and 300 by the plurality of connection wires 400. For example, the package substrate 100 may include a printed circuit board (PCB), a flexible substrate, a tape substrate, etc. The printed circuit board may be a multilayer circuit board having vias and various circuits therein.

The package substrate 100 may include a core layer 110, a plurality of conductive through vias 120, an upper conductive pattern 130, an upper insulating layer 140, a plurality of upper substrate pads 150, a lower conductive pattern 160, a lower insulating layer 170, a plurality of lower substrate pads 180, and a plurality of external connection bumps 190.

The core layer 110 may include a non-conductive material layer. The core layer 110 may include a reinforced polymer or the like. The core layer 110 may serve as a boundary layer that divides the package substrate 100 into an upper portion and a lower portion.

The plurality of conductive through vias 120 may penetrate (i.e., extend into) the core layer 110, and may electrically connect the upper conductive pattern 130 and the lower conductive pattern 160. When the first and second semiconductor chips 200 and 300 are disposed on the first surface 102 of the package substrate 100, the plurality of conductive through vias 120 may electrically connect the first and second semiconductor chips 200 and 300, and other semiconductor devices that are provided on the second surface 104 of the package substrate 100. That is, the plurality of conductive through vias 120 may electrically connect the first and second semiconductor chips 200 and 300 on the first surface 102 of the package substrate 100 to other semiconductor devices that are provided on the second surface 104 of the package substrate 100.

The upper insulating layer 140 and the lower insulating layer 170 may include a polymer or a dielectric layer. The upper insulating layer 140 and the lower insulating layer 170 may be formed by a vapor deposition process, a spin coating process, or the like.

The upper conductive pattern 130 may be provided in the upper insulating layer 140. The upper conductive pattern 130 may be electrically connected to the first and second semiconductor chips 200 and 300. The upper conductive patterns 130 may include power wiring or ground wiring as a power net that is configured to supply power to electronic components mounted on the package substrate 100. A power signal or a ground signal may be transmitted through the upper conductive pattern 130. The upper conductive pattern 130 may extend in a longitudinal direction of the core layer 110 within the upper insulating layer 140. A lower surface of the upper conductive pattern 130 may contact the core layer 110.

The plurality of upper substrate pads 150 may be exposed from the first surface 102 of the package substrate 100. The plurality of upper substrate pads 150 may be provided in the upper insulating layer 140. The plurality of upper substrate pads 150 may be electrically connected to the upper conductive patterns 130.

The plurality of upper substrate pads 150 may include at least one power pad 152 electrically connected to the power wiring, and at least one ground pad 154 electrically connected to the ground wiring. The plurality of upper substrate pads 150 may further include a plurality of substrate signal lines and substrate signal pads that are configured to transmit data signals to the electronic components.

The power pad 152 and the ground pad 154 may be disposed to be spaced apart from each other in a first horizontal direction. In the figures, a direction (X direction) in which the power pad 152 and the ground pad 154 are spaced apart from each other is referred to as the first horizontal direction, and a horizontal direction (Y direction) perpendicular to the first horizontal direction is referred to as a second horizontal direction. A direction (Z direction) perpendicular to the first horizontal direction and the second horizontal direction is referred to as a vertical direction.

Although only some upper substrate pads, some bonding pads, and some wirings are illustrated in the drawings, it will be understood that the number and arrangement of the upper substrate pads, the bonding pads, and the wirings are exemplary and are not limited thereto.

The lower conductive pattern 160 may be provided in the lower insulating layer 170. The lower conductive pattern 160 may be electrically connected to the first and second semiconductor chips 200 and 300. The power signal or the ground signal may be transmitted through the lower conductive pattern 160. The lower conductive pattern 160 may extend in the longitudinal direction of the core layer 110 within the lower insulating layer 170. An upper surface of the lower conductive pattern 160 may contact the core layer 110.

The plurality of lower substrate pads 180 may be exposed from the second surface 104 of the package substrate 100. The plurality of lower substrate pads 180 may be provided in the lower insulating layer 170. The plurality of lower substrate pads 180 may be electrically connected to the lower conductive patterns 160. The plurality of external connection bumps 190 may be provided on the plurality of lower substrate pads 180 to electrically connect to external devices. For example, the external connection bump 190 may include a solder ball.

The upper and lower substrate pads 150 and 180 and the upper and lower conductive patterns 130 and 160 may include aluminum (Al), copper (Cu), tin (Sn), nickel (Ni), gold (Au), platinum (Pt), or alloys thereof. The upper and lower substrate pads 150 and 180 and the upper and lower conductive patterns 130 and 160 may be formed by a plating process, an electroless plating process, a vapor deposition process, or the like.

The package substrate 100 may include a pad region PR, and a pattern routing region PRR provided to be spaced apart from the pad region PR. The pad region PR may be referred to as a region where the power pad 152 and the ground pad 154 are exposed, and the power pad 152 and the ground pad 154 may be exposed from the first surface 102 of the package substrate 100 on the pad region PR.

The pad region PR and the pattern routing region PRR may be arranged to be spaced apart by a predetermined distance. For example, each of the pad region PR and the pattern routing region PRR may have a substantially rectangular shape. In example embodiments, two pad regions PR and one pattern routing region PRR are exemplarily illustrated (e.g., see FIGS. 2 and 3), but it will be understood that the number of the pad region PR and the pattern routing region PRR is exemplary and is not limited thereto.

In example embodiments, the first semiconductor chip 200 may be stacked on the package substrate 100. The first semiconductor chip 200 may have a first upper surface 202 and a first lower surface 204 opposite to the first upper surface 202. The first semiconductor chip 200 may include at least one first lower chip pad 210, at least one second lower chip pad 220, and a plurality of lower option pads 230 that are arranged to be spaced apart from each other in the first horizontal direction (X direction). The first lower chip pad 210, the second lower chip pad 220, and the lower option pads 230 may be exposed from the first upper surface 202 of the first semiconductor chip 200. That is, the first lower chip pad 210, the second lower chip pad 220, and the lower option pads 230 may be free of the first upper surface 202 of the first semiconductor chip 200 thereon.

The first lower chip pad 210 may disposed to be spaced apart from the power pad 152 in the second horizontal direction (Y direction). The first lower chip pad 210 may be electrically connected to the power pad 152 through the connection wire 400. The first lower chip pad 210 may receive the power signal from the power pad 152.

The second lower chip pad 220 may disposed to be spaced apart from the ground pad 154 in the second horizontal direction (Y direction). The second lower chip pad 220 may be electrically connected to the ground pad 154 through the connection wire 400. The second lower chip pad 220 may receive the ground signal from the ground pad 154.

The plurality of lower option pads 230 may disposed to be spaced apart from the first and second lower chip pads 210 and 220 in the first horizontal direction (X direction). The plurality of lower option pads 230 may receive at least one of the power signal, the ground signal, or the data signal from the package substrate 100.

At least one of the lower option pads 230 may be electrically connected to a first upper chip pad 310 or a second upper chip pad 320 through the plurality of connection wires 400. The lower option pads 230 may include a first option pad 232 that receives the power signal from the first upper chip pad 310, and a second option pad 234 that receives the ground signal from the second upper chip pad 320. The lower option pads 230 may further include a third option pad 236 that receives the power signal or the ground signal from upper option pads 330 of the second semiconductor chip 300 to be described below.

The first semiconductor chip 200 may receive the power signal or the ground signal from the second semiconductor chip 300 through the plurality of connection wires 400 that are electrically connected to the lower option pads 230. Since the first semiconductor chip 200 receives the power signal or the ground signal from the second semiconductor chip 300 through the plurality of connection wires 400, the package substrate 100 may not include additional substrate pads for transmitting the power signal or the ground signal to the first semiconductor chip 200.

The plurality of lower option pads 230 may be disposed to be spaced apart from each other in the first horizontal direction (X direction). The plurality of lower option pads 230 may be disposed to be spaced apart from each other by a first distance L1 (also referred to as a first interval L1) (e.g., see FIG. 3). That is, the plurality of lower option pads 230 may be spaced apart at a first interval L1 in the first horizontal direction (X direction). For example, the first distance L1 (i.e., first interval L1) may within a range of 50 micrometers (μm) to 80 μm. The number of the lower option pads 230 may be in the range of 4 to 8.

The plurality of lower option pads 230 may be disposed to be spaced apart from the pattern routing region PRR of the package substrate 100 in the second horizontal direction (Y direction). Since the plurality of lower option pads 230 are not directly connected to the power pad 152 or the ground pad 154, space utilization of the package substrate 100 may be increased through the pattern routing region PRR.

In example embodiments, the second semiconductor chip 300 may be stacked on the first semiconductor chip 200. For example, the first semiconductor chip 200 may be between the package substrate 100 and the second semiconductor chip 300. The first and second semiconductor chips 200 and 300 may be sequentially stacked in a stepped shape on the first surface 102 of the package substrate 100. For example, the stepped shape of the first and second semiconductor chips 200 and 300 may extend in the second horizontal direction (Y direction). The second semiconductor chip 300 may have a second upper surface 302 and a second lower surface 304 opposite to the second upper surface 302.

The second semiconductor chip 300 may include at least one first upper chip pad 310, at least one second upper chip pad 320, and a plurality of upper option pads 330 that are arranged to be spaced apart from each other in the first horizontal direction (X direction). The first upper chip pad 310, the second upper chip pad 320, and the plurality of upper option pads 330 may be exposed from the second upper surface 302 of the second semiconductor chip 300. That is, the first upper chip pad 310, the second upper chip pad 320, and the plurality of upper option pads 330 may be free of the second upper surface 302 of the second semiconductor chip 300 thereon.

The first upper chip pad 310 may be disposed to be spaced apart from the first lower chip pad 210 in the second horizontal direction (Y direction). The first upper chip pad 310 may be provided on a first extension line that extends along the first lower chip pad 210 and the power pad 152 in the second horizontal direction (Y direction). The first upper chip pad 310 may be electrically connected to the power pad 152 through the plurality of connection wires 400. The first upper chip pad 310 may receive the power signal from the power pad 152.

The second upper chip pad 320 may be disposed to be spaced apart from the second lower chip pad 220 in the second horizontal direction (Y direction). The second upper chip pad 320 may be provided on a second extension line that extends along the second lower chip pad 220 and the ground pad 154 in the second horizontal direction (Y direction). The second upper chip pad 320 may be electrically connected to the ground pad 154 through the plurality of the connection wires 400. The second upper chip pad 320 may receive the ground signal from the ground pad 154.

The plurality of upper option pads 330 may be disposed to be spaced apart from the first and second upper chip pads 310 and 320 in the first horizontal direction (X direction). The plurality of upper option pads 330 may be spaced apart from the plurality of lower option pads 230 in the second horizontal direction (Y direction). The plurality of upper option pads 330 may receive at least one of the power signal, the ground signal, or the data signal from the package substrate 100.

The plurality of upper option pads 330 may be disposed to be spaced apart from each other in the first horizontal direction (X direction). The plurality of upper option pads 330 may be spaced apart from each other by a second distance L2 (also referred to as a second interval L2) (e.g., see FIG. 3). That is, the plurality of upper option pads 330 may be spaced apart at a second interval L2 in the first horizontal direction (X direction). For example, the second distance L2 (i.e., second interval L2) may be within a range of 50 μm to 80 μm. The number of the upper option pads 330 may be within a range of 4 to 8.

The plurality of upper option pads 330 may be disposed to be spaced apart from the pattern routing region PRR of the package substrate 100 in the second horizontal direction (Y direction). Since the plurality of upper option pads 330 are not directly connected to the power pad 152 or the ground pad 154, space utilization of the package substrate 100 may be increased through the pattern routing region PRR. The package substrate 100 may include additional upper conductive patterns 130 that are provided in the pattern routing region PRR to improve signal characteristics.

In example embodiments, the plurality of connection wires 400 may electrically connect the package substrate 100 and the first and second semiconductor chips 200 and 300 to each other. The plurality of connection wires 400 may include first, second and third conductive wires 410, 420, and 430.

The first and second conductive wires 410 and 420 may extend in the second horizontal direction (Y direction), respectively. The third conductive wires 430 may extend in a diagonal direction between the first and second horizontal directions (X direction and Y direction). The third conductive wires 430 may extend to cross the first and second conductive wires 410 and 420. The diagonal direction may be within a range of 0 degrees to 90 degrees from the first horizontal direction (X direction).

The first conductive wires 410 may transmit the power signal or the ground signal between the package substrate 100 and the first semiconductor chip 200. The first conductive wires 410 may electrically connect the power pad 152 and the ground pad 154 to the first and second lower chip pads 210 and 220, respectively. The first conductive wires 410 may transmit the power signal from the power pad 152 to the first lower chip pad 210. The first conductive wires 410 may transmit the ground signal from the ground pad 154 to the second lower chip pad 220.

The second conductive wires 420 may transmit the power signal or the ground signal between the first and second semiconductor chips 200 and 300. The second conductive wires 420 may electrically connect the first and second lower chip pads 210 and 220 to the first and second upper chip pads 310 and 320, respectively. The second conductive wires 420 may transmit the power signal from the first lower chip pad 210 to the first upper chip pad 310. The second conductive wires 420 may transmit the ground signal from the second lower chip pad 220 to the second upper chip pad 320.

The third conductive wires 430 may electrically connect the first upper chip pad 310 or the second upper chip pad 320 to at least one of the lower option pads 230. The at least one of the lower option pads 230 may receive the power signal or the ground signal from the power pad 152 or the ground pad 154 through the first to third conductive wires 410, 420, and 430.

The third conductive wires 430 may transmit the power signal between the first and second semiconductor chips 200 and 300. The lower option pads 230 may include the first option pad 232 that transmits the power signal. The third conductive wire 430 may electrically connect the first upper chip pad 310 to the first option pad 232. The third conductive wire 430 may transmit the power signal from the first upper chip pad 310 to the first option pad 232.

Additionally, the third conductive wires 430 may transmit the ground signal between the first and second semiconductor chips 200 and 300. The lower option pads 230 may include the second option pad 234 that transmits the ground signal. The third conductive wire 430 may electrically connect the second upper chip pad 320 to the second option pad 234. The third conductive wire 430 may transmit the ground signal from the second upper chip pad 320 to the second option pad 234.

In example embodiments, the plurality of connection wires 400 may further include fourth conductive wires 440 (e.g., see FIGS. 2 and 3). The fourth conductive wires 440 may electrically connect the plurality of lower option pads 230 of the first semiconductor chip 200 to the plurality of upper option pads 330 of the second semiconductor chip 300, respectively. The fourth conductive wires 440 may transmit the power signal from the plurality of lower option pads 230 to the plurality of upper option pads 330. The fourth conductive wires 440 may transmit the ground signal from the plurality of lower option pads 230 to the plurality of upper option pads 330. Ones of the plurality of upper option pads 330 may receive the power signal from the power pad 152 or the ground signal from the ground pad 154 through the first, second, third, and fourth conductive wires 410, 420, 430, and 440 of the plurality of connection wires 400.

The fourth conductive wires 440 may include at least one first wire 442 and at least one second wire 444. The first wire 442 may extend in the second horizontal direction (Y direction) to electrically connect the upper option pad 330 and the lower option pad 230, and the second wire 444 may extend in the diagonal direction between the first and second horizontal directions (X direction and Y direction) to electrically connect the upper option pad 330 and the lower option pad 230 (e.g., the third option pad 236).

The fourth conductive wires 440 may electrically connect at least one of the upper option pads 330 and at least one of the lower option pads 230. The first option pad 232 of the lower option pads 230 may receive the power signal from the power pad 152 through the first conductive wire 410, the second conductive wire 420, and the third conductive wire 430. The first option pad 232 of the lower option pads 230 may be electrically connected to an upper option pad 330 by the first wire 442 of the fourth conductive wires 440. The second option pad 234 of the lower option pads 230 may receive the ground signal from the ground pad 154 through the first conductive wire 410, the second conductive wire 420, and the third conductive wire 430. The second option pad 234 of the lower option pads 230 may be electrically connected to an upper option pad 330 by the first wire 442 of the fourth conductive wires 440. The third option pad 236 of the lower option pads 230 may receive the power signal or the ground signal from the power pad 152 or the ground pad 154 through the first conductive wire 410, the second conductive wire 420, the third conductive wire 430, the first wire 442 of the fourth conductive wires 440, and the second wire 444 of the fourth conductive wires 440. For example, the second wire 444 of the fourth conductive wires 440 may transmit the power signal between the first and second semiconductor chips 200 and 300. The upper option pad 330 may receive the power signal from the first upper chip pad 310 through the third conductive wire 430, the first wire 442 of the fourth conductive wires 440, and the second wire 444 of the fourth conductive wires 440. For example, at least one of the upper option pads 330 may receive the power signal from the power pad 152 or the ground signal from the ground pad 154 through the first conductive wire 410, the second conductive wire 420, the third conductive wire 430, the first wires 442 of the fourth conductive wires 440, and the second wire 444 of the fourth conductive wires 440. For example, the at least one of the upper option pads 330 may be electrically connected to the third option pad 236 of the lower option pads 230 by the first wire 442 of the fourth conductive wires 440.

The second wire 444 of the fourth conductive wires 440 may electrically connect the upper option pad 330 and the lower option pad 230. The second wire 444 of the fourth conductive wires 440 may transmit the power signal or the ground signal from the upper option pad 330 to the lower option pad 230 (e.g., the third option pad 236).

For example, the first to fourth conductive wires 410, 420, 430, and 440 may include copper (Cu), aluminum (Al), tungsten (W), nickel (Ni), molybdenum (Mo), gold (Au), Silver (Ag), chromium (Cr), tin (Sn), titanium (Ti), etc.

In example embodiments, the semiconductor package 10 may further include a molding member 500 on the package substrate 100 to cover the first and second semiconductor chips 200 and 300.

The molding member 500 may be provided on the package substrate 100 to protect the first and second semiconductor chips 200 and 300 and the plurality of connection wires 400 from the outside. For example, the molding member 500 may include an epoxy molding compound (EMC).

As mentioned above, the first semiconductor chip 200 stacked on the package substrate 100 may receive the power signal and the ground signal from the power pad 152 and the ground pad 154 that are electrically connected to the first and second lower chip pads 210 and 220 through the first conductive wires 410, respectively. The second semiconductor chip 300 stacked on the first semiconductor chip 200 may receive the power signal and the ground signal from the first and second lower chip pads 210 and 220 that are electrically connected to the first and second upper chip pads 310 and 320 through the second conductive wires 420, respectively. The lower option pads 230 of the first semiconductor chip 200 may receive the power signal or the ground signal from the at least one of the first and second upper chip pads 310 and 320 and the upper option pads 330 that are electrically connected through the third and fourth conductive wires 430 and 440.

Since the third and fourth conductive wires 430 and 440 transmit the power signal or the ground signal to the lower option pads 230, the semiconductor package 10 may not include additional power pads and additional ground pads for transmitting the power signal or the ground signal to the lower option pads 230. Since the package substrate does not include the additional power pad and the additional ground pad, pattern routability for providing a pattern may be secured. The pattern routability may be utilized to improve signal quality of the package substrate 100.

As used herein, the terms "comprises", "comprising", "includes", "including", "has", "having" and any other variations thereof specify the presence of the stated features, steps, operations, elements, components, and/or groups but do not preclude the presence or addition of one or more other features, steps, operations, elements, components, and/or groups thereof.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present disclosure. Accordingly, all such modifications are intended to be included within the scope of example embodiments as defined in the claims.

What is claimed is:

1. A semiconductor package, comprising:
a package substrate comprising a power pad and a ground pad that are spaced apart from each other in a first horizontal direction;
first and second semiconductor chips on the package substrate, wherein the first and second semiconductor chips are stacked in a stepped shape that extends in a second horizontal direction perpendicular to the first horizontal direction; and
a plurality of connection wires that electrically connect the package substrate to the first semiconductor chip and/or the second semiconductor chip,
wherein the first semiconductor chip comprises:
a first lower chip pad;
a second lower chip pad; and
a plurality of lower option pads that are spaced apart from the first and second lower chip pads in the first horizontal direction,
wherein the second semiconductor chip comprises:
a first upper chip pad;
a second upper chip pad; and
a plurality of upper option pads that are spaced apart from the first and second upper chip pads in the first horizontal direction, and
wherein the plurality of connection wires comprise:
a plurality of first conductive wires that electrically connect the power pad and the ground pad to the first and second lower chip pads, respectively;
a plurality of second conductive wires that electrically connect the first and second lower chip pads to the first and second upper chip pads, respectively; and
a third conductive wire that electrically connects at least one of the first and second upper chip pads to at least one of the lower option pads.

2. The semiconductor package of claim 1, wherein the plurality of lower option pads are spaced apart from the plurality of upper option pads in the second horizontal direction.

3. The semiconductor package of claim 2, wherein the plurality of connection wires further comprise a plurality of fourth conductive wires that electrically connect the plurality of lower option pads to the plurality of upper option pads, respectively.

4. The semiconductor package of claim 1, wherein the at least one of the lower option pads is configured to receive a power signal from the power pad or a ground signal from the ground pad through the first, second and third conductive wires.

5. The semiconductor package of claim 1, wherein the plurality of connection wires further comprise a plurality of fourth conductive wires that electrically connect the plurality of lower option pads to the plurality of upper option pads, respectively.

6. The semiconductor package of claim 5, wherein at least one of the upper option pads is configured to receive a power signal from the power pad or a ground signal from the ground pad through the first, second, third and fourth conductive wires.

7. The semiconductor package of claim 1, wherein the plurality of lower option pads are spaced apart at a first interval in the first horizontal direction, and the plurality of upper option pads are spaced apart at a second interval in the first horizontal direction, and
wherein the first and second intervals are each within a range of 50 μm to 80 μm.

8. The semiconductor package of claim 1, wherein there is a first number of the plurality of lower option pads and a second number of the plurality of upper option pads, and
wherein the first and second numbers are each within a range of 4 to 8.

9. The semiconductor package of claim 1, further comprising a molding member that is on the first and second semiconductor chips and the package substrate.

10. The semiconductor package of claim 1, wherein the first, second, and third conductive wires include at least one of copper (Cu), aluminum (Al), tungsten (W), nickel (Ni), molybdenum (Mo), gold (Au), silver (Ag), chromium (Cr), tin (Sn) or titanium (Ti).

11. A semiconductor package, comprising:
a package substrate comprising a power pad and a ground pad that are spaced apart from each other in a first horizontal direction;
a first semiconductor chip stacked on the package substrate, the first semiconductor chip comprising:
a first lower chip pad that is spaced apart from the power pad in a second horizontal direction perpendicular to the first horizontal direction;
a second lower chip pad that is spaced apart from the ground pad in the second horizontal direction; and
a plurality of lower option pads that are spaced apart from the first and second lower chip pads in the first horizontal direction;
a plurality of first conductive wires that electrically connect the power pad and the ground pad to the first and second lower chip pads, respectively;
a second semiconductor chip stacked on the first semiconductor chip, the second semiconductor chip comprising:
a first upper chip pad that is spaced apart from the power pad in the second horizontal direction;
a second upper chip pad that is spaced apart from the ground pad in the second horizontal direction; and
a plurality of upper option pads that are spaced apart from the first and second upper chip pads in the first horizontal direction;
a plurality of second conductive wires that electrically connect the first and second lower chip pads to the first and second upper chip pads, respectively; and
a third conductive wire that electrically connects at least one of the first and second upper chip pads to at least one of the lower option pads.

12. The semiconductor package of claim 11, wherein the plurality of lower option pads are spaced apart from the plurality of upper option pads in the second horizontal direction.

13. The semiconductor package of claim 12, further comprising a plurality of fourth conductive wires that electrically connect the plurality of lower option pads to the plurality of upper option pads, respectively.

14. The semiconductor package of claim 11, wherein the at least one of the lower option pads is configured to receive a power signal from the power pad or a ground signal from the ground pad through the first, second and third conductive wires.

15. The semiconductor package of claim 11, further comprising a plurality of fourth conductive wires that electrically connect the plurality of lower option pads to the plurality of upper option pads, respectively.

16. The semiconductor package of claim 15, wherein at least one of the upper option pads is configured to receive a power signal from the power pad or a ground signal from the ground pad through the first, second, third, and fourth conductive wires.

17. The semiconductor package of claim 11, wherein the plurality of lower option pads are spaced apart at a first interval in the first horizontal direction, and the plurality of upper option pads are spaced apart at a second interval in the first horizontal direction, and wherein the first and second intervals are each within a range of 50 µm to 80 µm.

18. The semiconductor package of claim 11, further comprising a molding member that is on the first and second semiconductor chips and the package substrate.

19. The semiconductor package of claim 11, wherein the first, second, and third conductive wires include at least one of copper (Cu), aluminum (Al), tungsten (W), nickel (Ni), molybdenum (Mo), gold (Au), silver (Ag), chromium (Cr), tin (Sn) or titanium (Ti).

20. A semiconductor package, comprising:

a package substrate comprising a power pad and a ground pad that are spaced apart from each other in a first horizontal direction;

first and second semiconductor chips stacked on the package substrate in a stepped shape that extends in a second horizontal direction perpendicular to the first horizontal direction;

a plurality of connection wires that electrically connect the package substrate to the first semiconductor chip and/or the second semiconductor chip; and a molding member that is on the first and second semiconductor chips and the package substrate, wherein the first semiconductor chip comprises:

a first lower chip pad that is spaced apart from the power pad in the second horizontal direction;

a second lower chip pad that is spaced apart from the ground pad in the second horizontal direction; and a plurality of lower option pads that are spaced apart from the first and second lower chip pads in the first horizontal direction, wherein the second semiconductor chip comprises:

a first upper chip pad that is spaced apart from the power pad in the second horizontal direction;

a second upper chip pad that is spaced apart from the ground pad in the second horizontal direction; and a plurality of upper option pads that are spaced apart from the first and second upper chip pads in the first horizontal direction, wherein the plurality of upper option pads are spaced apart from the plurality of lower option pads in the second horizontal direction, wherein the plurality of connection wires comprise:

a plurality of first conductive wires that electrically connect the power pad and the ground pad to the first and second lower chip pads, respectively;

a plurality of second conductive wires that electrically connect the first and second lower chip pads to the first and second upper chip pads, respectively; and a third conductive wire that electrically connects at least one of the first and second upper chip pads to at least one of the lower option pads, wherein the first and second lower chip pads and the plurality of lower option pads are free of at least a portion of an upper surface of the first semiconductor chip thereon, and wherein the first and second upper chip pads and the plurality of upper option pads are free of at least a portion of an upper surface of the second semiconductor chip thereon.

* * * * *